United States Patent [19]
Makino et al.

[11] Patent Number: 5,904,582
[45] Date of Patent: May 18, 1999

[54] STRUCTURE FOR ALTERING BUS BAR CIRCUITS

[75] Inventors: Masahiro Makino; Tsuguhito Shirakawa, both of Shizuoka, Japan

[73] Assignee: Yazaki Corporation, Tokyo, Japan

[21] Appl. No.: 08/997,048

[22] Filed: Dec. 23, 1997

[30] Foreign Application Priority Data

Dec. 26, 1996 [JP] Japan .................................. 8-348703

[51] Int. Cl.⁶ .................................................. H01R 9/09
[52] U.S. Cl. ............................................................ 439/76.2
[58] Field of Search ............................ 439/76.2, 212, 439/949; 361/775; 174/72 B, 71 B

[56] References Cited

U.S. PATENT DOCUMENTS

| | | | |
|---|---|---|---|
| 4,689,718 | 8/1987 | Maue et al. ............................ | 439/76.2 |
| 5,057,026 | 10/1991 | Sawai et al. ........................... | 439/76.2 |
| 5,295,842 | 3/1994 | Ozaki et al. ........................... | 439/76.2 |
| 5,322,445 | 6/1994 | Ozaki et al. ............................ | 439/949 |
| 5,416,972 | 5/1995 | Sugiura et al. ......................... | 439/76.2 |
| 5,530,625 | 6/1996 | VanDerStuyf et al. ................ | 439/949 |
| 5,618,186 | 4/1997 | Saka et al. ............................. | 439/76.2 |
| 5,626,492 | 5/1997 | Onizuka et al. ........................ | 439/949 |
| 5,782,651 | 7/1998 | Konoya .................................. | 439/949 |

FOREIGN PATENT DOCUMENTS 5-49139  2/1993  Japan .

*Primary Examiner*—Christopher A. Bennett
*Attorney, Agent, or Firm*—Armstrong, Westerman, Hattori, McLeland & Naughton

[57] ABSTRACT

A structure for altering bus bar circuits includes plural bus bars, a plurality of bus bar boards having plural terminal slots into which are to be inserted respectively and being stacked, a first and second supplemented tab being in the same projecting direction as that of a first and second tab separated from one of the bus bars for altering a circuit, and a supplemented bus bar having the first and second supplemented tab mounted on the same place as the first and second tab of the bus bars.

7 Claims, 4 Drawing Sheets

STRUCTURE FOR ALTERING BUS BAR CIRCUITS

BACKGROUND OF THE INVENTION

1. Field of the Invention

The present invention relates to a structure for altering bus bar circuits which can easily alter a circuit pattern on bus bar circuit boards.

2. Description of the Prior Art

As shown in FIG. 5, a conventional electrical junction box 50 which is described in JAPANESE PATENT APPLICATION Laid-open No. 5-49139 comprises plural bus bars arranged on a board (not shown), a plurality of bus bar boards 53 formed by inserting tabs of the plural bus bars into terminal slots of the board respectively, and a bus bar circuit board 54 stacked by a plurality of the bus bar boards 53. The terminal slots are formed through the board. The tabs are projected on fuse inlets 56, relay inlets 57, and connector inlets 58 formed in an upper case 55. The bus bar circuit board 54 means stacked bus bar boards.

For example, when FIG. 6 shows a circuit diagram of the bus bar board 54' in the electrical junction box 50, FIG. 7 shows a shape of a bus bar 51' corresponding to a bold line of the circuit diagram.

Even if both a cutting portion 63 and a cutting portion 64 are cut respectively, a remaining circuit after cutting the cutting portion 63 and 64 is electrically linked. So, by merely cutting the cutting portion 63 and 64 respectively, a preferred circuit pattern is made between a point 60 and a point 61.

However, when making another circuit pattern between the point 60 (60') and 62 (62'), there is a drawback that, by merely cutting several portions on the circuit diagram of FIG. 7, another preferred circuit pattern is not made. Because a remaining circuit after cutting several cutting portions is not linked electrically to each other.

SUMMARY OF THE INVENTION

An object of the present invention is to provide a structure for altering bus bar circuits which can easily make preferred circuit patterns.

According to the present invention, a supplemented bus bar has a first supplemented tab and a second supplemented tab in the same projecting direction and arranged place as that of a first tab and a second tab of a bus bar corresponding to an altering circuit. After cutting the first and second tab of the bus bar for altering the circuit, the first and second supplemented tab of the supplemented bus bar is arranged in order to be substituted for the first and second tab. So, a circuit pattern which cannot conventionally be made is easily formed.

Since, by inserting the first and second supplemented tab of the supplemented bus bar into terminal slots of plural bus bar boards, a preferred circuit pattern is made, a conventional board is used even when altering the circuit. So, product costs for altering the circuit are reduced.

BRIEF DESCRIPTION OF THE DRAWING

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

DESCRIPTION OF THE PREFERRED EMBODIMENT

FIG. 1 through FIG. 4 shows one embodiment of a structure for altering bus bar circuits which is a present invention.

Figure 1:
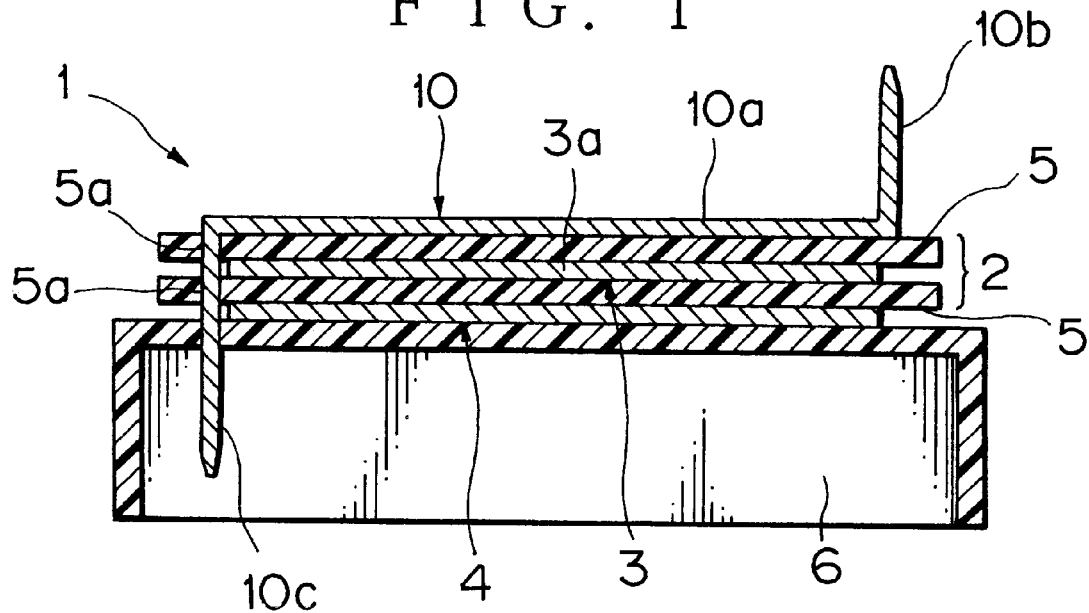
FIG. 1 shows one embodiment of a structure for altering bus bar circuits which is present invention.
Figure 2:
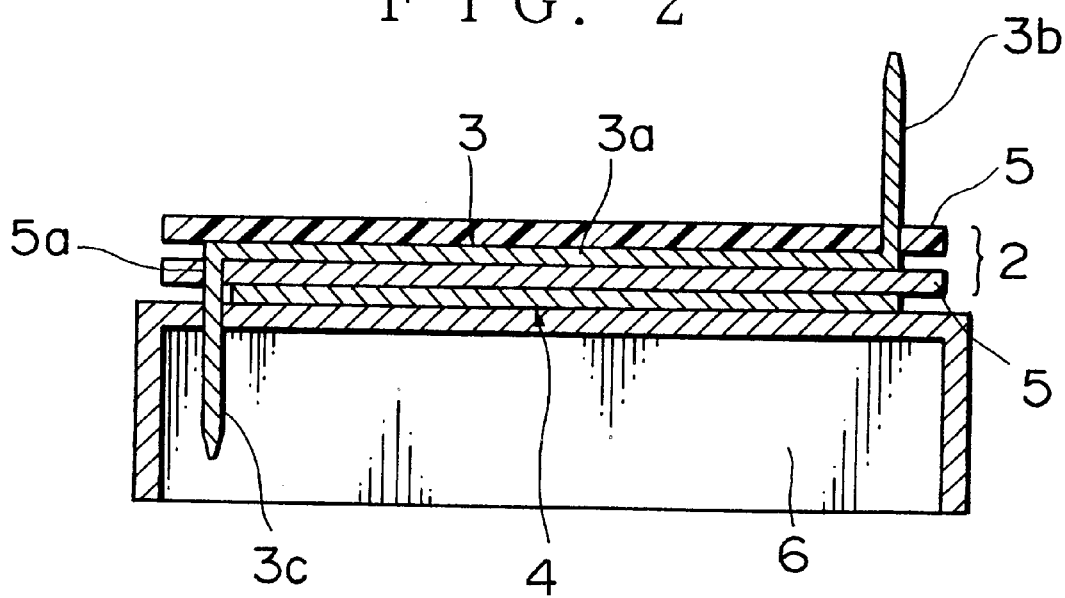
FIG. 2 shows a bus bar circuit board before altering a circuit.

As shown in FIG. 1, this structure for altering bus bar circuit 1 comprises a bus bar 3 on an altering circuit pattern, a bus bar 4 off the altering circuit pattern, a bus bar circuit board 2 having bus bar 3 and 4 as well as the altering circuit pattern, a supplemented bus bar 10 arranged on an uppermost layer of the bus bar circuit board 2. The bus bar 3 has a first tab 3b and a second tab 3c on both sides of a strap member 3a and in opposite direction in a state of not altering the circuit pattern (FIG. 2). The first tab 3b and the second tab 3c are cut for altering the circuit pattern. Numeral 6 shows a lower case. The bus bar circuit board 2 means stacked bus bar boards.

Figure 3:
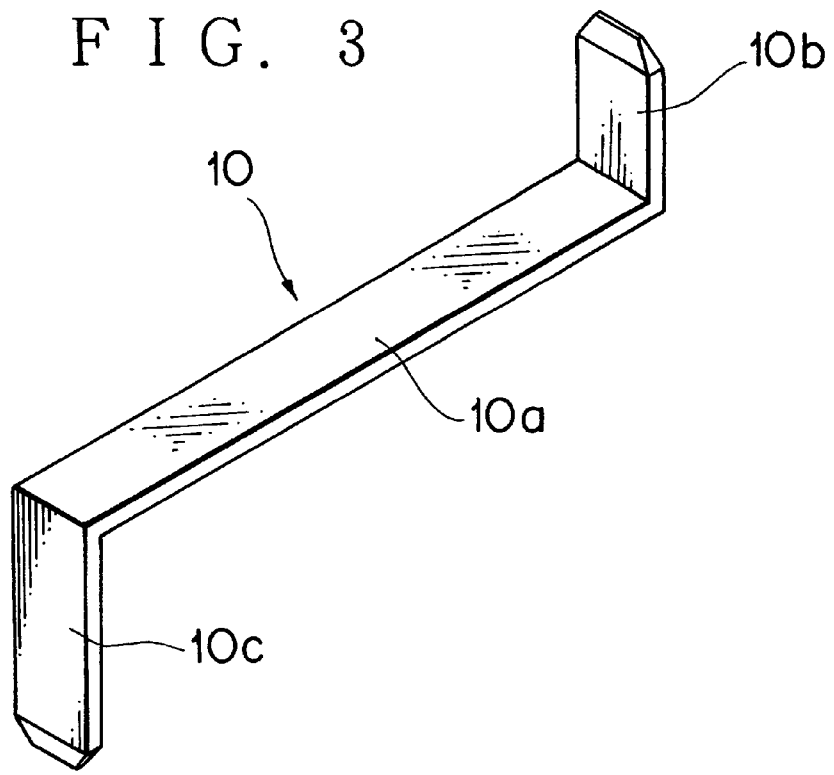
FIG. 3 shows a perspective view of a supplemented bus bar.
Figure 4:
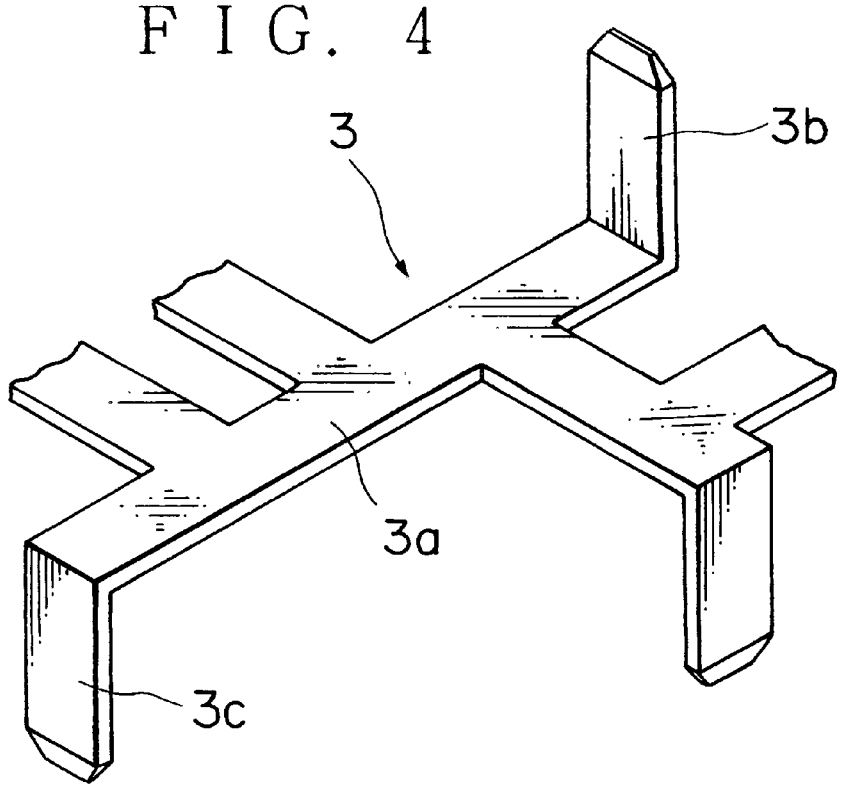
FIG. 4 shows a perspective view of a bus bar corresponding to an altering circuit.
Figure 5:
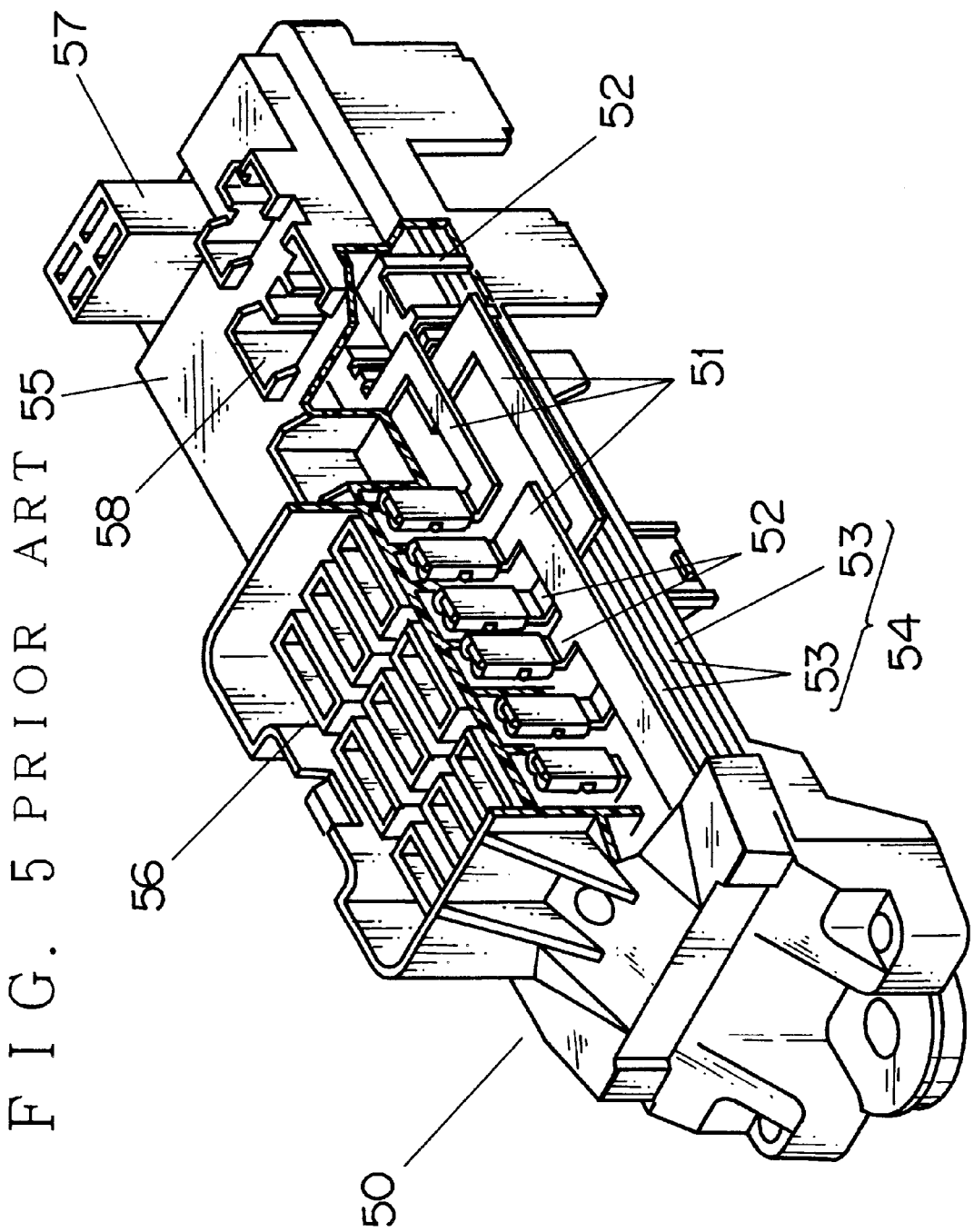
FIG. 5 shows a perspective views of a conventional electrical junction box.
Figure 6:
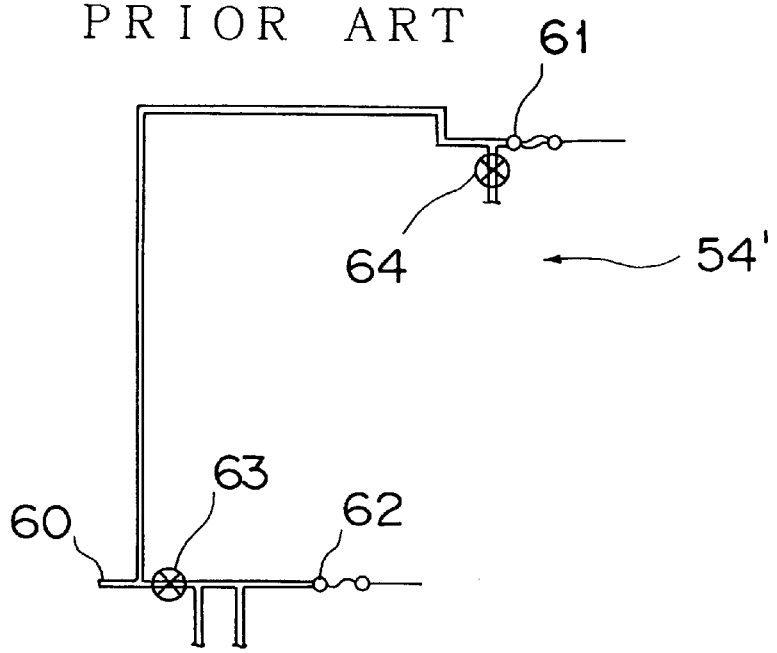
FIG. 6 is a circuit diagram before altering a circuit.
Figure 7:
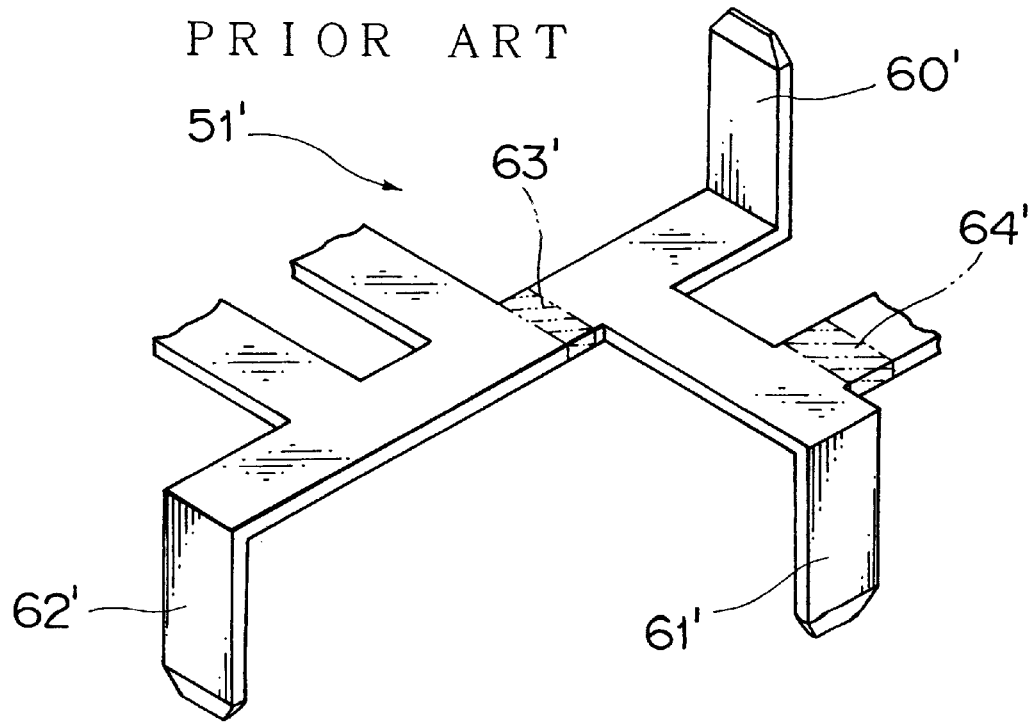
FIG. 7 shows a perspective views of a bus bar corresponding to a circuit diagram.

As shown in FIG. 3, the supplemented bus bar 10 comprises a supplemented strap member 10a, and a first supplemented tab 10b and a second supplemented tab 10c mounted on both sides of the supplemented strap member 10a. The supplemented strap member 10a is formed with the same shape as the strap member 3a projecting the first tab 3b and the second tab 3c (FIG. 4) in the state of not altering the circuit pattern. The first and second supplemented tab 10b and 10c on the supplemented strap member is formed in the same projecting direction and arranged place as that of the first and second tab 3b and 3c on the strap member. The first and second supplemented tab 10b and 10c is set with a preferred length.

By using this supplemented bus bar 10, any circuit pattern that is not made conventionally can be easily made. Since the circuit pattern is easily altered by cutting simply the first and second tab 3b and 3c of the bus bar 3, a laborious operation for determining cutting portions decreases whenever any circuit pattern is altered.

The supplemented bus bar 10 of the present embodiment comprises the straight line-like supplemented strap member 10a, and the first and second supplemented tab 10b and 10c being on both sides of the supplemented strap member 10a as well as in opposite direction. Also, the supplemented strap member 10a can be formed with any configuration except for straight line-like configuration. In addition, the supplemented tab 10b and 10c can be mounted on any places except for both sides of the supplemented strap member 10a. The supplemented bus bar 10 can be arranged on an lowermost layer of the bus bar circuit board 2 and between the uppermost layer and the lowermost layer.

The first and second supplemented tab 10b and 10c of the supplemented bus bar 10 is inserted into terminal slots 5a of a plurality of bus bar boards 5 respectively. Since, by applying to the terminal slots 5a formed through the plural bus bar board 5, the circuit pattern is easily altered, an operation for altering the circuit pattern excludes an excess operation. Therefore, product costs for altering operation are reduced.

What is claimed is:

1. A structure for altering bus bar circuits comprising:

plural bus bars;

a plurality of bus bars boards each having plural terminal slots into which tabs of said bus bars are to be inserted respectively and being stacked;

a first supplemented tab and a second supplemented tab being in the same projecting direction as that of a first tab and a second tab separated from one of said bus bars for altering a circuit; and a supplemented bus bar having said first supplemented tab and said second supplemented tab mounted on the same place as said first tab and said second tab.

2. The structure for altering bus bar circuits set forth in claim 1, wherein said supplemented bus bar is arranged on an uppermost layer of said stacked bus bar boards.

3. The structure for altering bus bar circuits set forth in claim 1, wherein said supplemented bus bar is arranged on a lowermost layer of said stacked bus bar boards.

4. The structure for altering bus bar circuits set forth in claim 1, wherein said supplemented bus bar arranged between an uppermost layer and a lowermost layer of said stacked bus bar boards.

5. The structure for altering bus bar circuits set forth in claim 2, wherein said first supplemented tab and said second supplemented tab are inserted into said terminal slots of said plural bus bar boards.

6. The structure for altering bus bar circuits set forth in claim 3, wherein said first supplemented tab and said second supplemented tab are inserted into said terminal slots of said plural bus bar boards.

7. The structure for altering bus bar circuits set forth in claim 4, wherein said first supplemented tab and said second supplemented tab are inserted into said terminal slots of said plural bus bar boards.

* * * * *